United States Patent
Izumi et al.

(10) Patent No.: US 10,207,502 B2
(45) Date of Patent: *Feb. 19, 2019

(54) LIQUID EJECTING HEAD, LIQUID EJECTING APPARATUS, AND PIEZOELECTRIC ELEMENT

(71) Applicant: Seiko Epson Corporation, Tokyo (JP)

(72) Inventors: Hideto Izumi, Chino (JP); Hideki Hahiro, Shiojiri (JP)

(73) Assignee: Seiko Epson Corporation (JP)

( * ) Notice: Subject to any disclaimer, the term of this patent is extended or adjusted under 35 U.S.C. 154(b) by 371 days.

This patent is subject to a terminal disclaimer.

(21) Appl. No.: 15/179,040

(22) Filed: Jun. 10, 2016

(65) Prior Publication Data

US 2016/0279947 A1  Sep. 29, 2016

Related U.S. Application Data

(63) Continuation of application No. 14/047,303, filed on Oct. 7, 2013, now Pat. No. 9,387,673.

(30) Foreign Application Priority Data

Oct. 25, 2012 (JP) .................. 2012-235423

(51) Int. Cl.
   *H01L 41/09*  (2006.01)
   *B41J 2/14*   (2006.01)
   *B41J 2/16*   (2006.01)

(52) U.S. Cl.
   CPC ........... *B41J 2/14233* (2013.01); *B41J 2/161* (2013.01); *B41J 2/1628* (2013.01); *B41J 2/1629* (2013.01);
   (Continued)

(58) Field of Classification Search
   CPC .... H01L 41/047; H01L 41/09; B41J 2/14233; B41J 2/161; B41J 2/1628; B41J 2/1629;
   (Continued)

(56) References Cited

U.S. PATENT DOCUMENTS 6,336,717 B1  1/2002  Shimada et al.
6,502,928 B1  1/2003  Shimada et al.
   (Continued)

FOREIGN PATENT DOCUMENTS

JP  09-286104 A   11/1997
JP  11-320878 A   11/1999
   (Continued)

*Primary Examiner* — Thomas Dougherty
(74) *Attorney, Agent, or Firm* — Harness, Dickey & Pierce, P.L.C.

(57) ABSTRACT

A liquid ejecting head includes a piezoelectric element having a first electrode on a vibration plate, a piezoelectric layer on the first electrode, and a second electrode on the piezoelectric material layer. The piezoelectric layer has functional portions sandwiched between the first and second electrodes; the second electrode configures a common electrode provided continuously across a plurality of the functional portions; the piezoelectric layer extends to an outer side of an end of the first electrode; the vibration plate has a first region opposing the first electrode, a second region opposing an area of the piezoelectric layer extending further toward an outer side than the first electrode, and a third region further toward the outer side than the piezoelectric layer; the second region has a thickness substantially equal to or greater than the thickness of the first region; and the third region is thinner than the first region.

10 Claims, 9 Drawing Sheets

(52) U.S. Cl.
CPC ........... *B41J 2/1631* (2013.01); *B41J 2/1632* (2013.01); *B41J 2/1635* (2013.01); *B41J 2/1642* (2013.01); *B41J 2/1646* (2013.01)

(58) Field of Classification Search
CPC ...... B41J 2/1631; B41J 2/1632; B41J 2/1635; B41J 2/1642; B41J 2/1646
USPC ....................................... 310/324, 328, 365
See application file for complete search history.

(56) References Cited

U.S. PATENT DOCUMENTS

| | | | |
|---|---|---|---|
| 8,201,926 | B2 | 6/2012 | Shimada |
| 8,579,417 | B2 * | 11/2013 | Yazaki ................. B41J 2/14233 29/25.35 |
| 9,132,637 | B2 | 9/2015 | Hirai et al. |
| 9,387,673 | B2 * | 7/2016 | Izumi .................... B41J 2/14233 |
| 9,662,882 | B2 * | 5/2017 | Hirai .................... B41J 2/14274 |
| 2005/0068377 | A1 | 3/2005 | Ishikawa et al. |
| 2006/0077237 | A1 | 4/2006 | Shin et al. |
| 2008/0127471 | A1 | 6/2008 | Matsuzawa |
| 2008/0199598 | A1 | 8/2008 | Sugahara |
| 2009/0053402 | A1 | 2/2009 | Sekiguchi et al. |
| 2009/0284568 | A1 | 11/2009 | Yazaki |
| 2011/0193916 | A1 | 8/2011 | Hirai et al. |
| 2014/0292946 | A1 | 10/2014 | Nakao et al. |
| 2015/0224771 | A1 * | 8/2015 | Hirai ...................... B41J 2/1612 347/70 |
| 2015/0360469 | A1 | 12/2015 | Hirai et al. |
| 2016/0101621 | A1 * | 4/2016 | Naganuma ............ H01L 41/081 347/71 |

FOREIGN PATENT DOCUMENTS

| | | |
|---|---|---|
| JP | 2000-071449 A | 3/2000 |
| JP | 2000-326503 A | 11/2000 |
| JP | 2005-119271 A | 5/2005 |
| JP | 2008-198960 A | 8/2008 |
| JP | 2009-172878 A | 8/2009 |
| JP | 2010-208071 A | 9/2010 |
| JP | 2011-165916 A | 8/2011 |
| JP | 2012-178558 A | 9/2012 |

* cited by examiner

LIQUID EJECTING HEAD, LIQUID EJECTING APPARATUS, AND PIEZOELECTRIC ELEMENT

CROSS-REFERENCE TO RELATED APPLICATIONS

This is a continuation patent application of U.S. application Ser. No. 14/047,303 filed Oct. 7, 2013, which claims priority to Japanese Patent Application No. 2012-235423 filed Oct. 25, 2012, both of which are expressly incorporated by reference herein in their entireties.

BACKGROUND

1. Technical Field

The present invention relates to liquid ejecting heads and liquid ejecting apparatuses that eject a liquid from a nozzle by causing a piezoelectric element to deform, and particularly relates to piezoelectric elements.

2. Related Art

A liquid ejecting head that ejects liquid droplets from nozzles that communicate with corresponding pressure generation chambers by causing piezoelectric elements (piezoelectric actuators) to deform and produce pressure variations in the liquid within the pressure generation chambers is known. An ink jet recording head that ejects ink droplets as the liquid droplets can be given as a representative example thereof.

Such an ink jet recording head includes piezoelectric actuators, serving as piezoelectric elements, on, for example, one surface side of a flow channel formation plate in which the pressure generation chambers that communicate with nozzle openings is provided, and the ink droplets are ejected from the nozzles by driving the piezoelectric actuators, causing a vibration plate to deform, and producing pressure changes in the pressure generation chambers.

The piezoelectric actuators are each configured of a first electrode, a piezoelectric material layer, and a second electrode provided on the vibration plate (see, for example, JP-A-2009-172878).

A configuration in which a region of the piezoelectric material layer sandwiched between the first electrode and the second electrode serves as a functional portion, and the second electrode serves as a common electrode that is shared by a plurality of functional portions by being provided continuously across the plurality of functional portions, has also been disclosed.

However, there is demand for further improvement in the displacement properties of a piezoelectric element configured with the second electrode serving as a common electrode.

It should be noted that these problems are not limited to ink jet recording heads, and are also present in other liquid ejecting heads that eject liquids aside from ink.

SUMMARY

It is an advantage of some aspects of the invention to provide a liquid ejecting head, a liquid ejecting apparatus, and a piezoelectric element that improve displacement properties by suppressing breakdowns such as cracking and the like.

A liquid ejecting head according to an aspect of the invention includes a piezoelectric element having a first electrode provided on a vibration plate, a piezoelectric material layer provided on the first electrode, and a second electrode provided on the piezoelectric material layer. Here, the piezoelectric material layer has a plurality of functional portions sandwiched between the first electrode and the second electrode; the second electrode configures a common electrode provided continuously across a plurality of the functional portions; the piezoelectric material layer is provided so as to extend to an outer side of an end portion of the first electrode; the vibration plate has a first region opposing the first electrode, a second region that opposes an area of the piezoelectric material layer that extends further toward an outer side than the first electrode, and a third region provided further toward the outer side than the piezoelectric material layer; the second region has a thickness that is substantially equal to or greater than the thickness of the first region; and the third region is thinner than the first region.

According to this aspect, displacement properties of the piezoelectric element can be improved by setting the vibration plate to be thinner at the third region than at the first region. In addition, breakdowns such as cracking can be suppressed from occurring in the vibration plate when the piezoelectric element deforms by setting the vibration plate to be substantially the same thickness as or a greater thickness at the second region than the thickness at the first region.

Here, the vibration plate may have a first vibration plate and a second vibration plate provided on the side of the first vibration plate on which the first electrode is located.

In addition, it is preferable for a difference in the thickness of the second vibration plate at the second region relative to the first region to be no greater than 10% of the thickness of the second vibration plate at the first region. According to this configuration, the vibration plate can be suppressed from breaking down at the second region.

In addition, it is preferable for the thickness of the second vibration plate at the third region to be 20 to 80% the thickness of the second vibration plate at the first region. According to this configuration, the displacement properties of the piezoelectric element can be improved with certainty.

Furthermore, another aspect of the invention is a liquid ejecting apparatus including the liquid ejecting head according to the aforementioned aspects.

According to this aspect, a liquid ejecting apparatus including a piezoelectric element that suppresses breakdowns and improves displacement properties can be realized.

A piezoelectric element according to another aspect of the invention includes a first electrode provided on a vibration plate, a piezoelectric material layer provided on the first electrode, and a second electrode provided on the piezoelectric material layer. Here, the piezoelectric material layer has a plurality of functional portions sandwiched between the first electrode and the second electrode; the second electrode configures a common electrode provided continuously across a plurality of the functional portions; the piezoelectric material layer is provided so as to extend to an outer side of an end portion of the first electrode; the vibration plate has a first region opposing the first electrode, a second region that opposes an area of the piezoelectric material layer that extends further toward an outer side than the first electrode, and a third region provided further toward the outer side than the piezoelectric material layer; the second region has a thickness that is substantially equal to or greater than the thickness of the first region; and the third region is thinner than the first region.

According to this aspect, displacement properties of the piezoelectric element can be improved by setting the vibration plate to be thinner at the third region than at the first region. In addition, breakdowns such as cracking can be suppressed from occurring in the vibration plate when the piezoelectric element deforms by setting the vibration plate to be substantially the same thickness as or a greater thickness at the second region than the thickness at the first region.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the drawings.

First Embodiment

Figure 1:
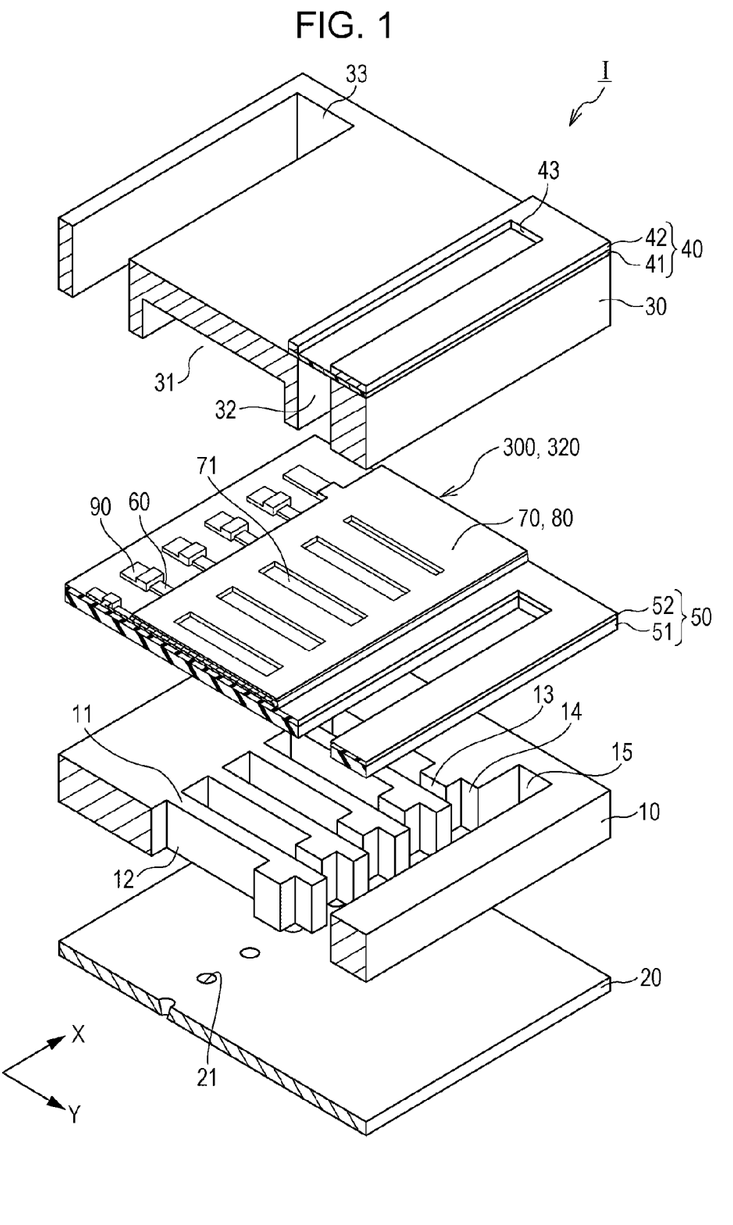
FIG. 1 is an exploded perspective view of a recording head according to a first embodiment of the invention.
Figure 2A:
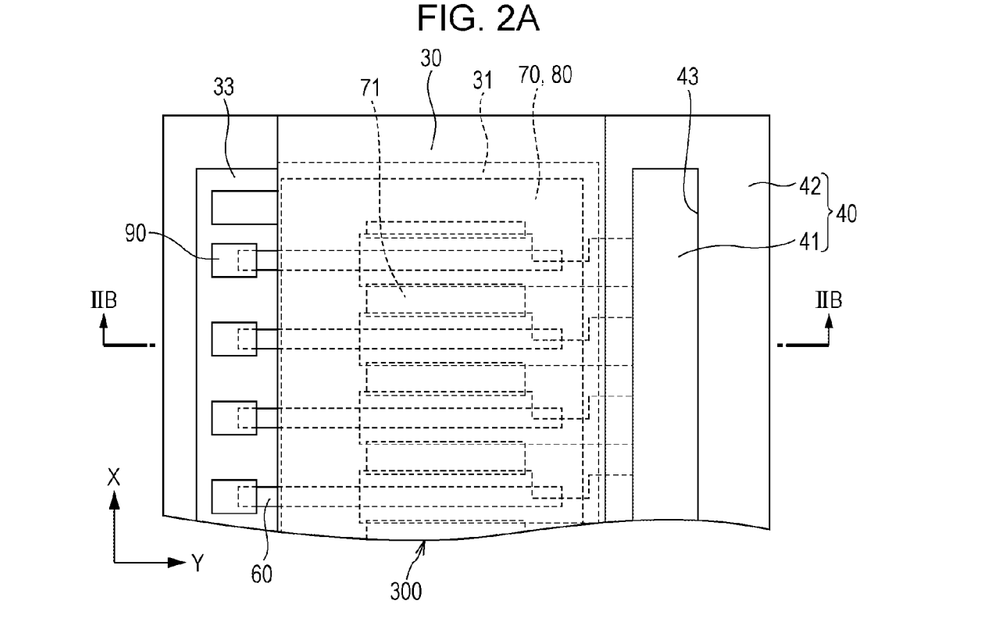
FIGS. 2A and 2B are a plan view and a cross-sectional view, respectively, of a recording head according to the first embodiment of the invention.
Figure 2B:
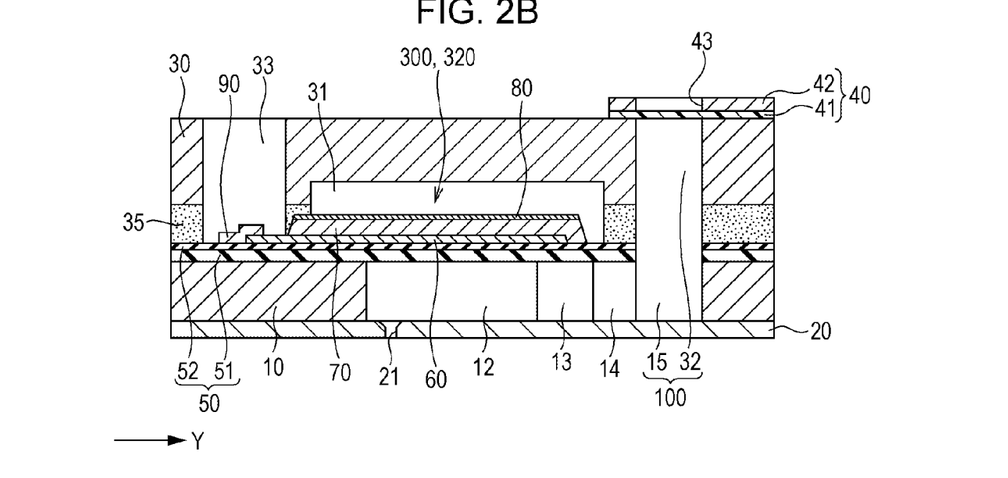
Figure 3A:
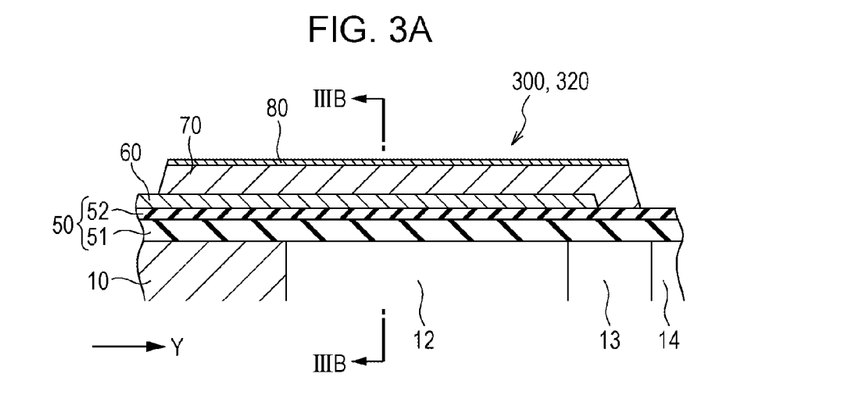
FIGS. 3A and 3B are cross-sectional views of a recording head according to the first embodiment of the invention.
Figure 3B:
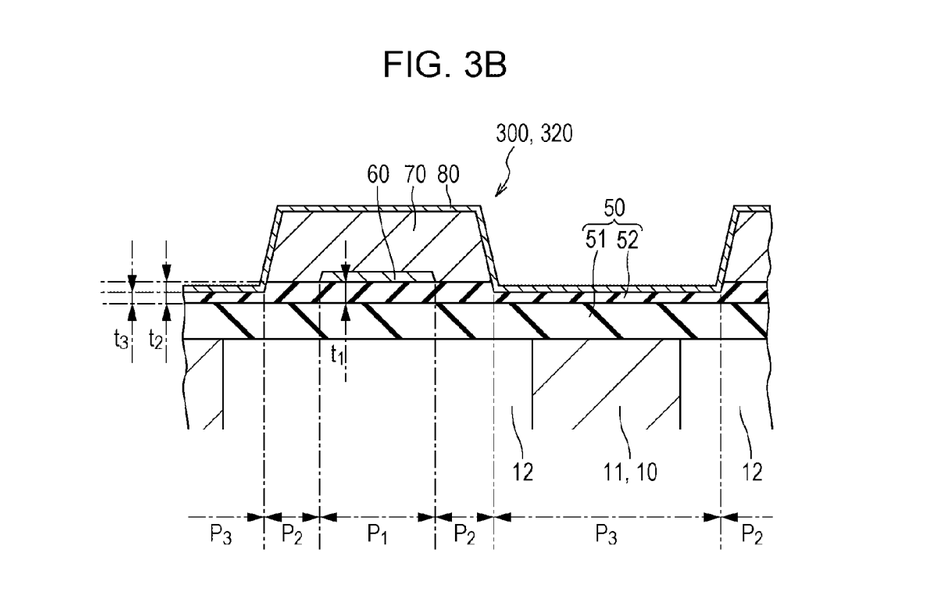

FIG. 1 is a perspective view of an ink jet recording head serving as an example of a liquid ejecting head according to a first embodiment of the invention, FIGS. 2A and 2B are a plan view and a cross-sectional view, respectively, of the ink jet recording head, and FIGS. 3A and 3B are cross-sectional views illustrating primary components in an enlarged manner.

As shown in the drawings, pressure generation chambers 12 are formed in a flow channel formation plate 10 provided in an ink jet recording head I serving as an example of the liquid ejecting head according to this embodiment. The pressure generation chambers 12, which are defined by a plurality of partition walls 11, are arranged along a direction in which a plurality of nozzle openings 21 that eject ink of the same color are arranged. Hereinafter, this direction will be referred to as an "arrangement direction of the pressure generation chambers 12" or a "first direction X". The pressure generation chambers 12 are arranged in the flow channel formation plate 10 in a plurality of rows in the first direction (two rows, in this embodiment). The direction in which the plurality of rows of the pressure generation chambers 12, which are formed along the first direction X, are arranged will be referred to hereinafter as a "second direction Y".

Furthermore, ink supply channels 13 and communication channels 14 are defined by a plurality of partition walls 11 on one end side in the lengthwise direction of the pressure generation chambers 12 in the flow channel formation plate 10, or in other words, on one end side in the second direction Y that is orthogonal to the first direction X. A communication portion 15 that configures part of a manifold 100 is formed on an outer side of the communication channels 14 (that is, the opposite side in the second direction Y to the side on which the pressure generation chambers 12 are located), the manifold 100 serving as an ink chamber (a liquid chamber) that is common for all of the pressure generation chambers 12. In other words, liquid flow channels configured of the pressure generation chambers 12, the ink supply channels 13, the communication channels 14, and the communication portion 15 are provided in the flow channel formation plate 10.

A nozzle plate 20 in which the nozzle openings 21 that communicate with corresponding pressure generation chambers 12 are provided is affixed, using an adhesive, a thermally-welded film, or the like, to one surface side of the flow channel formation plate 10, or in other words, to a surface on which the liquid flow channels including the pressure generation chambers 12 and the like are open. In other words, the nozzle openings 21 are arranged in the nozzle plate 20 in the first direction X.

A vibration plate 50 is formed on the other surface side of the flow channel formation plate 10. The vibration plate 50 according to this embodiment includes an elastic film 51 formed on the flow channel formation plate 10 and serving as a first vibration plate, and an insulator film 52 formed on the elastic film 51 and serving as a second vibration plate. Note that the liquid flow channels including the pressure generation chambers 12 and the like are formed through anisotropic etching from one surface of the flow channel formation plate 10, and the vibration plate 50 (the elastic film 51) configures the other surface of the liquid flow channels including the pressure generation chambers 12 and the like.

Piezoelectric elements 300 configured of a first electrode 60 having a thickness of, for example, approximately 0.2 µm, a piezoelectric material layer 70 having a thickness of, for example, approximately 1.0 µm, and a second electrode 80 having a thickness of, for example, approximately 0.05 µm are formed upon the insulator film 52. The piezoelectric elements 300 provided on this plate (the flow channel formation plate 10) serve as an actuator apparatus according to this embodiment.

Although this embodiment illustrates a configuration in which the first electrode 60 is provided on a plate (the flow channel formation plate 10) with the vibration plate 50 therebetween, the invention is not particularly limited thereto, and the first electrode 60 may be provided directly on the plate without providing the vibration plate 50. In other words, the first electrode 60 may act as a vibration plate. That is, "on the plate" refers not only to being directly on the plate but also to a state of being on (above) the plate with another member interposed therebetween.

The piezoelectric elements 300 that configure the actuator apparatus will be described in further detail hereinafter. FIGS. 3A and 3B are cross-sectional views of the piezoelectric actuator according to the first embodiment of the invention.

As shown in FIGS. 3A and 3B, the first electrode 60 that partially configures the piezoelectric elements 300 is divided into parts that correspond to each pressure generation chamber 12, and this configures individual electrodes that are independent for each piezoelectric element 300. The individual first electrodes 60 are formed so as to be narrower than the pressure generation chambers 12 in the first direction X of the pressure generation chambers 12. In other words, an end portion of each first electrode 60 is, in the first direction X of the pressure generation chambers 12, located on the inner side in a region opposing the corresponding pressure generation chamber 12. Meanwhile, both ends of each first electrode 60 extend, in the second direction Y of the pressure generation chambers 12, to the outer sides of the corresponding pressure generation chamber 12. Although the material of the first electrodes 60 is not particularly limited as long as the material is a metal, platinum (Pt), iridium (Ir), or the like can be used favorably for this material.

The piezoelectric material layer 70 is provided continuously along the first direction X, so as to have a predetermined width in the second direction Y. The width of the piezoelectric material layer 70 in the second direction Y is greater than the length of the pressure generation chambers 12 in the second direction Y. Accordingly, the piezoelectric material layer 70 is provided so as to extend, in the second direction Y of the pressure generation chambers 12, to the outer sides of the pressure generation chambers 12.

An end portion of the piezoelectric material layer 70 at one end of the pressure generation chambers 12 in the second direction Y (in this embodiment, an ink supply channel side) is located further toward the outer side than the end portions of the first electrodes 60. In other words, the end portions of the first electrodes 60 are covered by the piezoelectric material layer 70. An end portion of the piezoelectric material layer 70 on the other side of the pressure generation chambers 12 in the second direction Y is located further toward the inner side (that is, further toward the pressure generation chambers 12) than the end portions of the first electrodes 60.

Note that lead electrodes 90 configured of gold (Au) or the like are connected to corresponding first electrodes 60 that extend to the outer side of the piezoelectric material layer 70. Although not shown in the drawings, the lead electrodes 90 configure terminal portions to which connection wires connected to a driving circuit or the like are connected.

Meanwhile, recess portions 71 that oppose corresponding partition walls 11 are formed in the piezoelectric material layer 70. The width of the recess portions 71 in the first direction X is approximately the same as, or wider than, the width of the partition walls 11 in the first direction X. Accordingly, the rigidity of areas of the vibration plate 50 that oppose end portions of the pressure generation chambers 12 in the width direction thereof (so-called "arm portions" of the vibration plate 50) is suppressed, making it possible for the piezoelectric elements 300 to displace in a favorable manner.

A perovskite-structure crystal film (a perovskite type crystal) configured of a ferroelectric ceramic material exhibiting an electromechanical transduction effect and formed on the first electrodes 60 can be given as an example of the piezoelectric material layer 70. A ferroelectric piezoelectric material such as lead zirconate titanate (PZT), a material obtained by adding a metal oxide such as niobium oxide, nickel oxide, magnesium oxide, or the like thereto, or the like can be used as the material of the piezoelectric material layer 70. To be more specific, lead titanate ($PbTiO_3$), lead zirconate titanate ($Pb(Zr,Ti)O_3$), lead zirconate ($PbZrO_3$), lead lanthanum titanate ($(Pb,La),TiO_3$), lead lanthanum zirconate titanate ($(Pb,La)(Zr,Ti)O_3$), lead magnesium niobate zirconium titanate ($Pb(Zr,Ti)(Mg,Nb)O_3$), or the like can be used. In this embodiment, lead zirconate titanate (PZT) is used for the piezoelectric material layer 70.

The material of the piezoelectric material layer 70 is not limited to a lead-based piezoelectric material containing lead, and a lead-free piezoelectric material that does not contain lead can be used as well. Bismuth ferrite (($BiFeO_3$), abbr. "BFO"), barium titanate (($BaTiO_3$), abbr. "BT"), potassium sodium niobate (($K,Na)(NbO_3$), abbr. "KNN"), potassium sodium lithium niobate (($K,Na,Li)(NbO_3$)), potassium sodium lithium niobate tantalate (($K,Na,Li)(Nb,Ta)O_3$), bismuth potassium titanate (($Bi_{1/2}K_{1/2})TiO_3$, abbr. "BKT"), bismuth sodium titanate (($Bi_{1/2}Na_{1/2})TiO_3$, abbr. "BNT"), bismuth manganate ($BiMnO_3$, abbr. "BM"), complex oxides containing bismuth, potassium, titanium and iron and having a perovskite structure ($x[(Bi_xK_{1-x})TiO_3]-(1-x)[BiFeO_3]$, abbr. "BKT-BF"), complex oxides containing bismuth, iron, barium, and titanium and having a perovskite structure ($(1-x)[BiFeO_3]-x[BaTiO_3]$, abbr. "BFO-BT"), a material obtained by adding a metal such as manganese, cobalt, chromium or the like thereto ($(1-x)[Bi(Fe_{1-y}M_y)O_3]-x[BaTiO_3]$ (where M is Mn, Co, or Cr)), and the like can be given as examples of lead-free piezoelectric materials.

The second electrode 80 is provided continuously on the piezoelectric material layer 70 in the first direction X of the pressure generation chambers 12, and configures a common electrode that is shared by a plurality of the piezoelectric elements 300. An end portion of the second electrode 80 at one end side of the pressure generation chambers 12 in the second direction Y is positioned further on the outer side than the end portion of the piezoelectric material layer 70. In other words, the end portion of the piezoelectric material layer 70 is covered by the second electrode 80. An end portion of the second electrode 80 on the other side of the pressure generation chambers 12 in the second direction Y is located further on the inner side (that is, further toward the pressure generation chambers 12 side) than the end portion of the piezoelectric material layer 70. Although the material of the second electrode 80 is not particularly limited as long as the material is a metal, iridium (Ir) or the like can be used favorably for this material.

The piezoelectric element 300 configured in this manner displaces when a voltage is applied between the first electrode 60 and the second electrode 80. In other words, piezoelectric strain is produced in the piezoelectric material layer 70 sandwiched between the first electrode 60 and the second electrode 80 when a voltage is applied between the two electrodes. The area of the piezoelectric material layer 70 where the piezoelectric strain occurs when the voltage is applied between the two electrodes is referred to as a "functional portion 320". On the other hand, the area of the piezoelectric material layer 70 where the piezoelectric strain does not occur is referred to as a "non-functional portion". In the functional portion 320 where piezoelectric strain occurs in the piezoelectric material layer 70, an area opposing the pressure generation chamber 12 is referred to as a "flexible portion", whereas areas on the outer sides of the pressure generation chamber 12 are referred to as "non-flexible portions".

In this embodiment, the first electrode 60, the piezoelectric material layer 70, and the second electrode 80 are all provided continuously to the outer sides of the corresponding pressure generation chamber 12 in the second direction Y of the pressure generation chambers 12. In other words, the functional portion 320 is provided continuously to the outer sides of the corresponding pressure generation chamber 12. Accordingly, an area of the functional portion 320 that opposes the pressure generation chamber 12 for that piezoelectric element 300 serves as the flexible portion, and areas on the outer sides of the pressure generation chamber 12 serve as the non-flexible portions.

Note that because the first electrodes 60 are divided into parts that correspond to each pressure generation chamber 12 as described above, stepped areas are formed in the piezoelectric elements 300 by the first electrodes 60 along the second direction Y, or in other words, along the lengthwise direction of the functional portions 320 (the second direction Y).

In other words, the vibration plate 50 includes, along the first direction X, first regions $P_1$ that are regions of the vibration plate 50 opposing the first electrodes 60, second regions $P_2$ opposing areas of the piezoelectric material layer 70 that extend further toward the outer side than the first electrodes 60, and third regions $P_3$ that are regions provided further toward the outer side than the piezoelectric material layer 70.

The thickness of the vibration plate 50 at the second regions $P_2$ is substantially the same as or greater than the thickness at the first regions $P_1$. Here, the thickness of the vibration plate 50 refers to the thickness in a direction orthogonal to the surface of the flow channel formation plate 10 on which the vibration plate 50 is provided. In other words, the thickness of the vibration plate 50 is the thickness of the vibration plate 50 in the direction in which the layers of the piezoelectric elements 300 are stacked.

As described above, the thickness of the vibration plate 50 at the second regions $P_2$ refers to the areas opposed to the regions of the piezoelectric material layer 70 on the outer sides of the first electrodes 60. Note that the second regions $P_2$ of the vibration plate 50 having substantially the same thickness as the first regions $P_1$ means that the difference in thickness of the second regions in the insulator film 52, which serves as the second vibration plate of which the vibration plate 50 is partially configured, relative to the first regions is less than or equal to 10% of the thickness of the first regions. In other words, when the thickness of the insulator film 52 at the second regions $P_2$ is taken as a thickness $t_2$ and the thickness at the first regions $P_1$ is taken as a thickness $t_1$, the relationship $t_2 \geq 0.9 \times t_1$ is fulfilled.

Meanwhile, the thickness of the vibration plate 50 at the third regions $P_3$ is lower than the thickness $t_1$ at the first regions $P_1$. In this embodiment, it is preferable for the thickness of the insulator film 52 in the vibration plate 50 at the third regions $P_3$ to be greater than or equal to 20% of the thickness of the insulator film 52 at the first regions and less than or equal to 80% of the thickness of the insulator film 52 at the first regions. In other words, it is preferable for a thickness $t_3$ of the insulator film 52 at the third regions $P_3$ to fulfill the relationship $0.2 \times t_1 \leq t_3 \leq 0.8 \times t_1$.

Here, in this embodiment, the third regions $P_3$ are provided opposing border areas between the partition walls 11 in the flow channel formation plate 10 and the pressure generation chambers 12, and thus making the vibration plate thinner at the third regions $P_3$ than at the first regions $P_1$ makes it possible to reduce the rigidity of the so-called arm portions of the vibration plate 50, which are regions of the non-functional portion at the regions (flexible portions 12) that oppose the pressure generation chambers 12; this makes it possible to improve the piezoelectric properties. Accordingly, a large amount of displacement can be obtained with a low voltage. Incidentally, increasing the thickness of the vibration plate 50 at the third regions $P_3$ increases the rigidity of the arm portions and leads to a drop in the displacement properties.

Furthermore, setting the thickness of the vibration plate 50 at the second regions $P_2$ to the same or a greater thickness than at the first regions $P_1$ makes it possible to suppress breakdowns such as cracking and the like in the vibration plate 50 at the second regions $P_2$.

Figure 4:
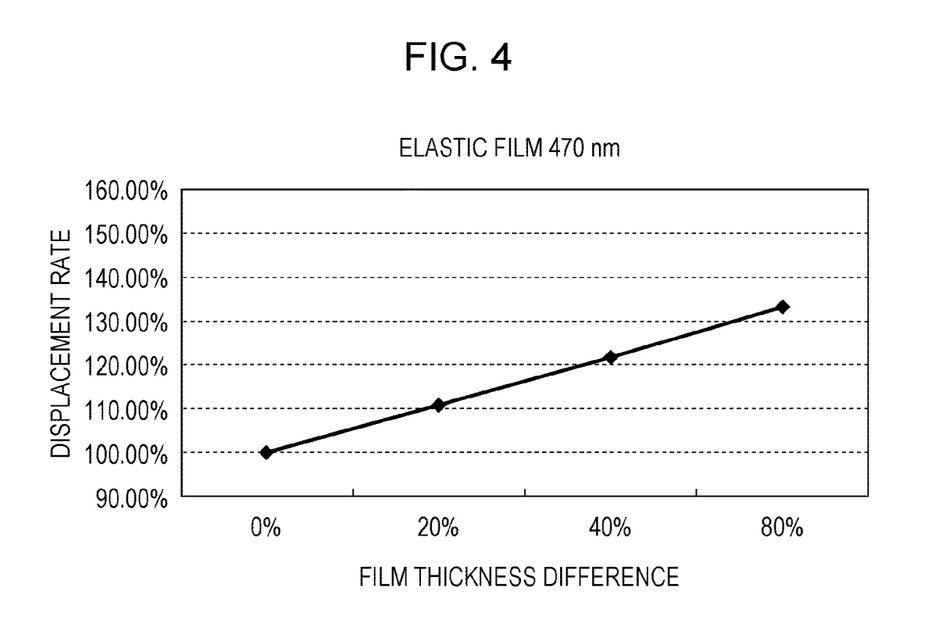
FIG. 4 is a graph illustrating a thickness of a vibration plate and a displacement rate according to the first embodiment of the invention.

Displacement rates of the piezoelectric elements 300 in the case where the thickness $t_3$ of the insulator film 52 at the third regions $P_3$ is changed were measured. The results are shown in FIG. 4. Note that displacement amounts were found when using a vibration plate 50 in which the elastic film 51 is 470 nm thick and the insulator film 52 is 150 nm thick and a voltage of 25 V was applied to the piezoelectric elements 300, and FIG. 4 illustrates displacement rates as a ratio of displacement amounts when the thickness of the insulator film 52 at the third regions $P_3$ was changed relative to the thickness at the first regions $P_1$, using the displacement amount when the thickness $t_3$ of the insulator film 52 at the third regions $P_3$ is the same as the thickness $t_1$ at the first regions $P_1$ as 100%.

As shown in FIG. 4, the displacement rate of the piezoelectric elements 300 (the functional portions 320) can be improved, regardless of the thickness of the elastic film 51, by setting the thickness $t_3$ of the insulator film 52 at the third regions $P_3$ to be lower than the thickness $t_1$ at the first regions $P_1$. In particular, in the case where the elastic film 51 is 470 nm thick, the displacement amount can be improved by approximately 30% by setting the thickness of the insulator film 52 at the third regions $P_3$ to 20% of the thickness at the first regions $P_1$.

A protective plate 30 that protects the piezoelectric elements 300 is affixed, using an adhesive 35, on the flow channel formation plate 10 in which the piezoelectric elements 300 are formed. A piezoelectric element holding portion 31, which is a recess defining a space that houses the piezoelectric elements 300, is provided in the protective plate 30. Furthermore, a manifold portion 32 that configures part of the manifold 100 is provided in the protective plate 30. The manifold portion 32 is formed passing through the protective plate 30 in the thickness direction thereof and spanning in the width direction of the pressure generation chambers 12, and communicates with the communication portion 15 of the flow channel formation plate 10 described above. Meanwhile, a through-hole 33 that passes through the protective plate 30 in the thickness direction thereof is provided in the protective plate 30. The lead electrodes 90 connected to the first electrodes 60 in the respective piezoelectric elements 300 are exposed inside the through-hole 33. The lead electrodes 90 connected to the corresponding first electrodes 60 in the piezoelectric elements 300 are exposed within the through-hole 33, and one end of each of the connection wires connected to the driving circuit (not shown) is connected to a corresponding lead electrode 90 within the through-hole 33.

A compliance plate 40, configured of a sealing membrane 41 and an anchoring plate 42, is affixed onto the protective plate 30. The sealing membrane 41 is configured of a flexible material having a low rigidity, and one surface of the manifold portion 32 is sealed by the sealing membrane 41. The anchoring plate 42, meanwhile, is formed of a hard material such as a metal or the like. The region of the anchoring plate 42 that opposes the manifold 100 has an opening portion 43 in which the anchoring plate 42 has been completely removed in the thickness direction, and thus one surface of the manifold 100 is sealed using only the flexible sealing membrane 41.

In the ink jet recording head I according to this embodiment, ink is imported from an ink introduction port connected to an external ink supply unit (not shown), and after the interior from the manifold 100 to the nozzle openings 21 has been filled with ink, a voltage is applied between the first electrodes 60 corresponding to respective pressure generation chambers 12 and the second electrode 80 in accordance with recording signals from a driving circuit. As a result, the vibration plate 50 bends and deforms along with the piezoelectric elements 300, increasing pressure within the pressure generation chambers 12 and ejecting ink droplets from the nozzle openings 21.

Next, a method for manufacturing the ink jet recording head according to this embodiment will be described. FIGS. 5A to 8C are cross-sectional views taken along the first direction X, illustrating a method for manufacturing the ink jet recording head.

Figure 5A:
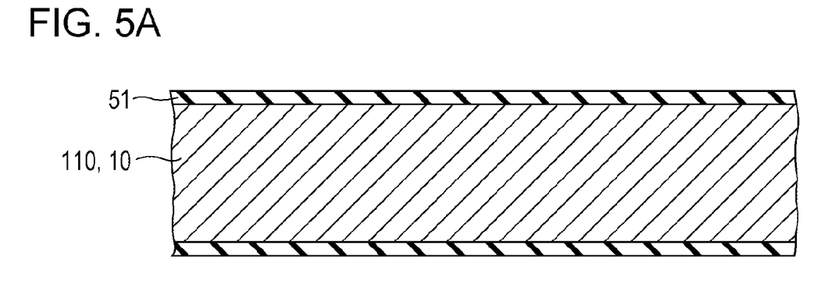
FIGS. 5A to 5C are cross-sectional views illustrating a method for manufacturing a recording head according to the first embodiment of the invention.

First, as shown in FIG. 5A, the elastic film 51 is formed on a surface of a flow channel formation plate wafer 110, which is a silicon wafer. In this embodiment, the elastic film 51 is formed from silicon dioxide by thermally oxidizing the flow channel formation plate wafer 110. Of course, the material of the elastic film 51 is not limited to silicon dioxide, and a silicon nitride film, a polysilicon film, an organic film (polyimide, parylene, and so on), or the like may be used as well. Furthermore, the method for forming the elastic film 51 is not limited to thermal oxidizing, and the elastic film 51 may be formed through sputtering, CVD, spin coating, or the like.

Figure 5B:
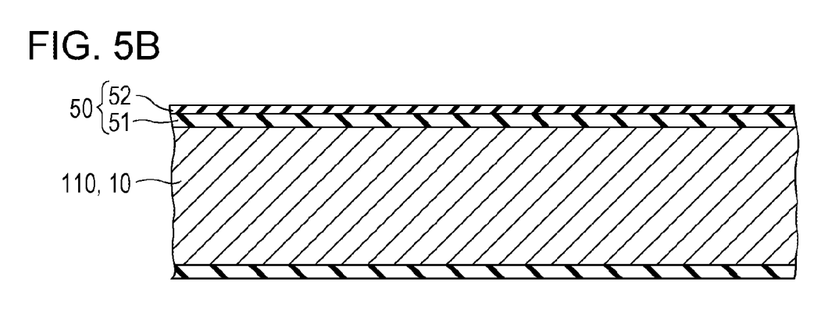

Next, as shown in FIG. 5B, the insulator film 52 is formed from zirconium oxide on the elastic film 51. Of course, the insulator film 52 is not limited to zirconium oxide, and titanium oxide ($TiO_2$), aluminum oxide ($Al_2O_3$), hafnium oxide ($HfO_2$), magnesium oxide (MgO), lanthanum aluminate ($LaAlO_3$), or the like may be used as well. Sputtering, CVD, another type of vapor deposition, or the like can be given as methods for forming the insulator film 52.

Figure 5C:
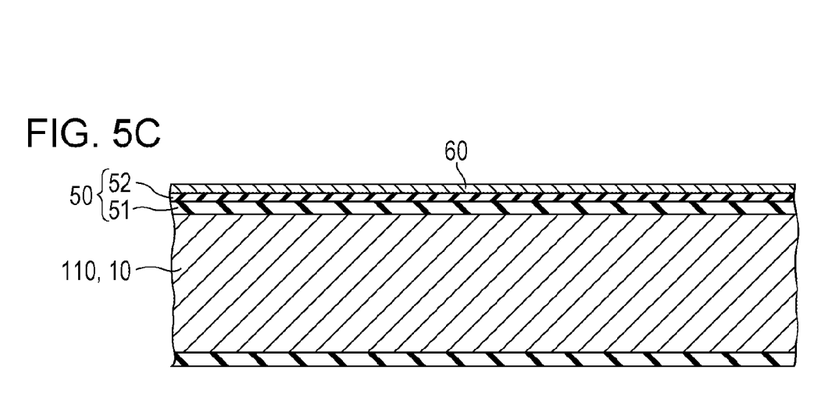

Next, as shown in FIG. 5C, the first electrode 60 is formed on the entire surface of the insulator film 52. Although the material used for the first electrode 60 is not particularly limited, it is desirable, in the case where lead zirconate titanate (PZT) is employed as the piezoelectric material layer 70, to use a material whose conductivity experiences little change in response to the diffusion of lead oxide. Accordingly, platinum, iridium, and the like are used favorably as the material of the first electrode 60. In addition, the first electrode 60 can be formed through sputtering, PVD (physical vapor deposition), or the like.

Figure 6A:
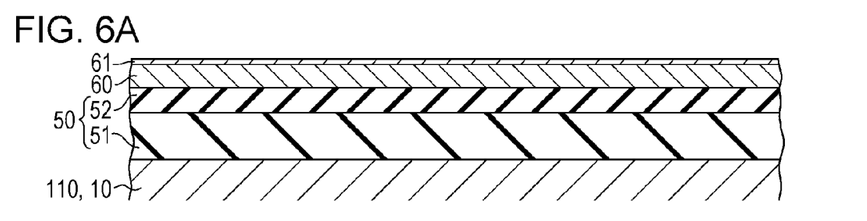
FIGS. 6A to 6E are cross-sectional views illustrating a method for manufacturing a recording head according to the first embodiment of the invention.

Next, as shown in FIG. 6A, a crystal seed layer 61 configured of titanium (Ti) is formed on the first electrode 60. Providing the crystal seed layer 61 on the first electrode 60 in this manner makes it possible to control the preferred orientation direction of the piezoelectric material layer 70 to (100) when forming the piezoelectric material layer 70 on the first electrode 60 over the crystal seed layer 61 in a later step, which in turn makes it possible to obtain a piezoelectric material layer 70 favorable for use as an electromechanical transducer. Note that the crystal seed layer 61 functions as a seed for accelerating crystallization when the piezoelectric material layer 70 crystallizes, and diffuses into the piezoelectric material layer 70 after the piezoelectric material layer 70 is sintered. In addition, although titanium (Ti) is used for the crystal seed layer 61 in this embodiment, the crystal seed layer 61 is not particularly limited thereto as long as the material can serve as nuclei for the crystals of the piezoelectric material layer 70 when forming the piezoelectric material layer 70 in later steps; for example, titanium oxide ($TiO_2$) may be used for the crystal seed layer 61, and a material aside from titanium and titanium oxide, such as lanthanum nickel oxide, can be used as well. Of course, the configuration may be such that the crystal seed layer 61 remains between the first electrode 60 and the piezoelectric material layer 70. The crystal seed layer 61 may have a layer shape, or may have an island shape.

Figure 6B:
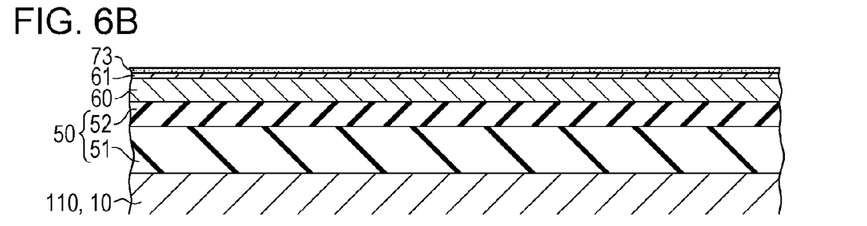

Next, in this embodiment, the piezoelectric material layer 70, configured of lead zirconate titanate (PZT), is formed. Here, in this embodiment, the piezoelectric material layer 70 is formed using what is known as the sol-gel method, where the piezoelectric material layer 70 configured of a metal oxide is obtained by applying a sol in which a metal complex has been dissolved and dispersed throughout a liquid medium, allowing the sol to dry and turn into a gel, and then sintering the gel at a high temperature. However, the method for forming the piezoelectric material layer 70 is not limited to the sol-gel method, and MOD (metal-organic decomposition), sputtering, or a physical vapor deposition (PVD) technique such as laser abrasion may be used as well. In other words, the piezoelectric material layer 70 may be formed using either of a liquid-phase method or a gas-phase method.

To describe a specific procedure for forming the piezoelectric material layer 70, first, a piezoelectric material precursor film 73, which is a PZT precursor film, is deposited upon the crystal seed layer 61, as shown in FIG. 6B. In other words, a sol (solution) containing a metal complex is applied to the flow channel formation plate wafer 110 on which the first electrode 60 (the crystal seed layer 61) has been formed (an application step). The method for applying the sol is not particularly limited, and spin coating using a spin coat apparatus, slit coating using a slit nozzle coater, and so on can be given as other examples. Next, the piezoelectric material precursor film 73 is heated to a predetermined temperature and allowed to dry for a set amount of time (a drying step). For example, in this embodiment, the piezoelectric material precursor film 73 can be dried by being held at 170 to 180° C. for 8 to 30 minutes.

Next, the dried piezoelectric material precursor film 73 is degreased by being heated to a predetermined temperature and held at that temperature for a set amount of time (a degreasing step). For example, in this embodiment, the piezoelectric material precursor film 73 is degreased by being heated to a temperature of approximately 300 to 400° C. and held at that temperature for 10 to 30 minutes. Note that "degreasing" as described here refers to separating organic components contained in the piezoelectric material precursor film 73 as, for example, $NO_2$, $CO_2$, $H_2O$, or the like.

Figure 6C:
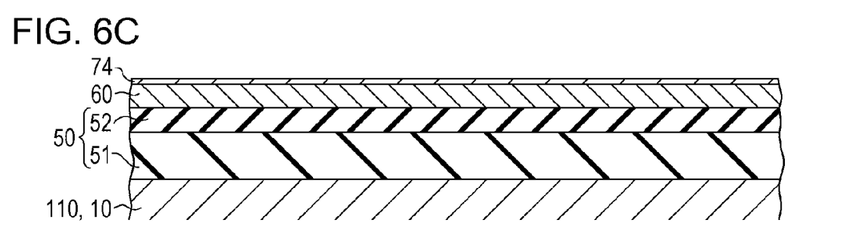

Next, as shown in FIG. 6C, a piezoelectric material film 74 is formed by heating the piezoelectric material precursor film 73 to a predetermined temperature and holding that temperature for a set amount of time in order to crystallize the piezoelectric material precursor film 73 (a sintering step). It is preferable to heat the piezoelectric material precursor film 73 to no less than 700° C. in this sintering step. Note also that it is preferable for the rate of the rise in temperature in the sintering step to be greater than or equal to 50° C./sec. A piezoelectric material film 74 having superior properties can be obtained as a result.

The crystal seed layer 61 formed on the first electrode 60 diffuses into the piezoelectric material layer 74. Of course, the crystal seed layer 61 may remain as titanium between the first electrode 60 and the piezoelectric material 74, or may remain as titanium oxide.

For example, a hot plate, an RTP (rapid thermal processing) device that heats using an infrared lamp, or the like can be used as the heating device employed in the drying step, the degreasing step, and the sintering step.

Figure 6D:
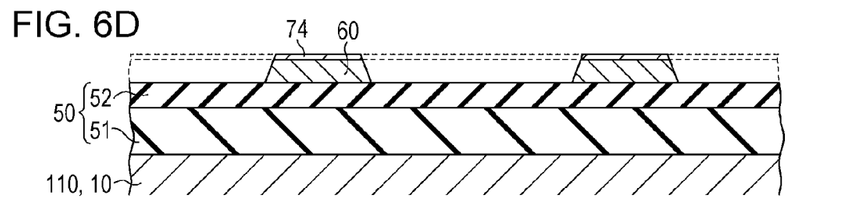

Next, as shown in FIG. 6D, at the stage where a first layer of the piezoelectric material film 74 has been formed on the first electrode 60, the first electrode 60 and the first layer of the piezoelectric material film 74 are simultaneously patterned so that the side surfaces thereof are sloped. The patterning of the first electrode 60 and the first layer of the piezoelectric material film 74 can be carried out through dry etching such as ion milling.

In the case where, for example, the first layer of the piezoelectric material film 74 is formed after first patterning the first electrode 60, the first electrode 60 is patterned through photoprocessing, ion milling, and asking, and thus changes in the qualities of the surface of the first electrode 60, the crystal seed layer provided on that surface, and so on will result. If the piezoelectric material film 74 is then formed on the surface whose qualities have changed, the piezoelectric material film 74 will not have a favorable crystalline state; the crystal growth in the second and subsequent layers of the piezoelectric material film 74 will be affected by the crystalline state of the first layer of the piezoelectric material film 74 as well, and thus the piezoelectric material layer 70 cannot be formed having a favorable crystalline state.

However, if the first layer of the piezoelectric material film 74 is formed and then patterned simultaneously with the first electrode 60, the first layer of the piezoelectric material film 74 will have stronger qualities as a seed for favorable crystal growth in the second and subsequent layers of the piezoelectric material film 74 than a crystal seed such as titanium; accordingly, even if an extremely thin layer whose qualities have changed is formed on the surface layer during the patterning, that layer will not have a large effect on the crystal growth in the second and subsequent layers of the piezoelectric material film 74.

In addition, in this embodiment, the surface of the vibration plate 50 is not etched or is etched very little when etching the first electrode 60 and the piezoelectric material film 74. Accordingly, the second regions in the vibration plate 50 can be set to substantially the same thickness as the first regions or a thickness that is greater than the thickness of the first regions, without over-etching the second regions.

Incidentally, because the first electrodes 60 function as the individual electrodes for corresponding functional portions 320, it is necessary to completely divide the first electrode 60 through etching in order for the individual first electrodes 60 to correspond to respective functional portions 320. On the other hand, it is necessary to manage the thicknesses of the first electrode 60 and the piezoelectric material film 74, and manage the etching time, so that the vibration plate 50 is over-etched very little, and it is difficult to etch the first electrode 60 and the piezoelectric material film 74 while not etching the vibration plate 50 at all. Accordingly, in this embodiment, the vibration plate 50 is considered to have substantially the same thickness at the second regions as at the first regions even in the case where the difference in thickness of the insulator film 52, of which the vibration plate 50 is partially configured, at the second regions thereof relative to the first regions is less than or equal to 10% of the thickness of the insulator film 52 at the first regions.

Figure 6E:
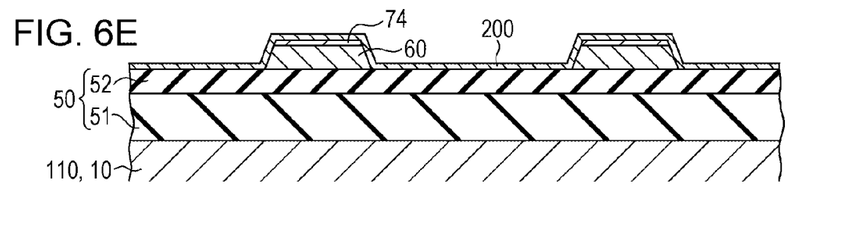

Next, as shown in FIG. 6E, after the first layer of the piezoelectric material film 74 and the first electrode 60 have been patterned, an intermediate crystal seed layer 200 is formed spanning the top of the insulator film 52, the side surfaces of the individual first electrodes 60, the side surfaces of the first layer of the piezoelectric material film 74, and the top of the piezoelectric material film 74. The intermediate crystal seed layer 200 can employ titanium, lanthanum nickel oxide, or the like, in the same manner as the crystal seed layer 61. Like the crystal seed layer, the intermediate crystal seed layer may have a layer shape, or may have an island shape.

Figure 7A:
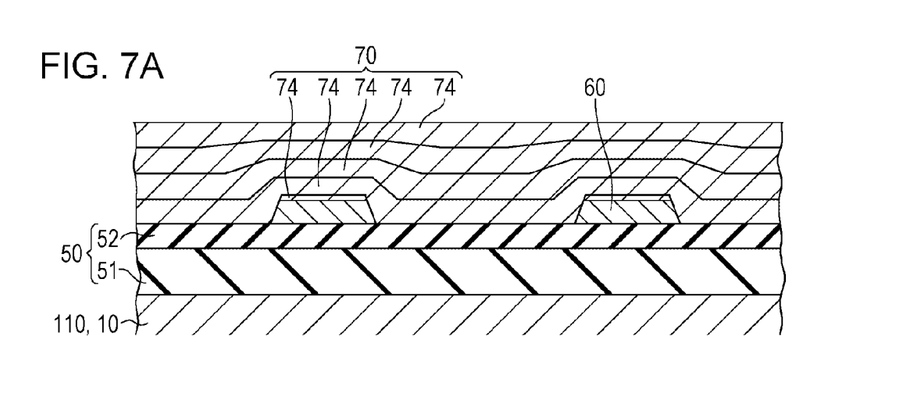
FIGS. 7A to 7C are cross-sectional views illustrating a method for manufacturing a recording head according to the first embodiment of the invention.

Next, as shown in FIG. 7A, the piezoelectric material layer 70 is formed from a plurality of layers of the piezoelectric material film 74, which are formed by repeating a piezoelectric material film formation process including the aforementioned application step, drying step, degreasing step, and sintering step a plurality of times.

Incidentally, the second and subsequent layers of the piezoelectric material film 74 are formed so as to be continuous across the top of the insulator film 52, the side surfaces of the first electrodes 60 and the first layer of the piezoelectric material film 74, and the top of the first layer of the piezoelectric material film 74. Because the intermediate crystal seed layer 200 is formed in the regions where the second and subsequent layers of the piezoelectric material film 74 are formed, the preferred orientation in the second and subsequent layers of the piezoelectric material film 74 can be controlled to (100) by the intermediate crystal seed layer 200, and the film can be formed with extremely small particle diameters. Note that the intermediate crystal seed layer 200 functions as a seed for accelerating crystallization when the piezoelectric material layer 70 crystallizes, and thus may be entirely diffused into the piezoelectric material layer 70 after the piezoelectric material layer 70 is sintered, or may partially remain as-is or as an oxidant.

Figure 7B:
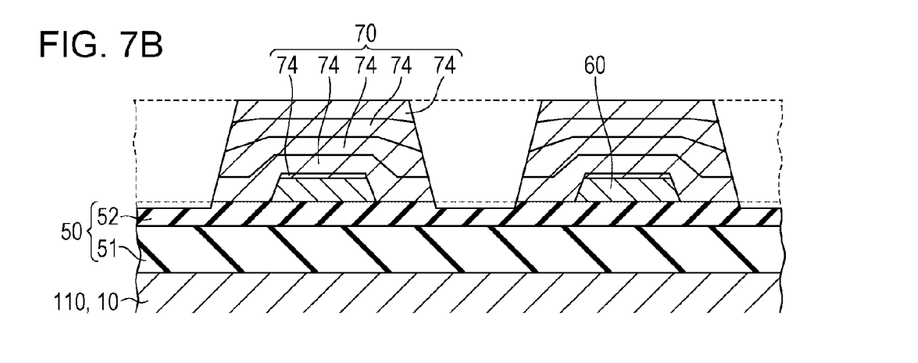

Next, as shown in FIG. 7B, the piezoelectric material layer 70 is patterned at regions opposing the respective pressure generation chambers 12. In this embodiment, the patterning is performed through what is known as photolithography, in which a mask (not shown) formed in a predetermined shape is provided upon the piezoelectric material layer 70 and the piezoelectric material layer 70 is etched over this mask. Dry etching such as reactive ion etching, ion milling, or the like can be given as examples of techniques for patterning the piezoelectric material layer 70. Furthermore, part of the vibration plate 50 in the thickness direction thereof is removed through over-etching when the piezoelectric material layer 70 is etched. Accordingly, the vibration plate 50 at the third regions can be made thinner than at the first regions.

Incidentally, the amount of over-etching carried out when etching the vibration plate 50 can be adjusted based on the etching time. Although this embodiment describes etching the piezoelectric material layer 70 and part of the vibration plate 50 simultaneously through dry etching, it should be noted that the embodiment is not limited thereto, and part of the vibration plate 50 may be removed through dry etching after the piezoelectric material layer 70 has been patterned through wet etching.

In this manner, the third regions can be formed by etching the vibration plate 50 simultaneously with the patterning of the piezoelectric material layer 70, which makes it possible to simplify the manufacturing process and reduce costs.

Figure 7C:
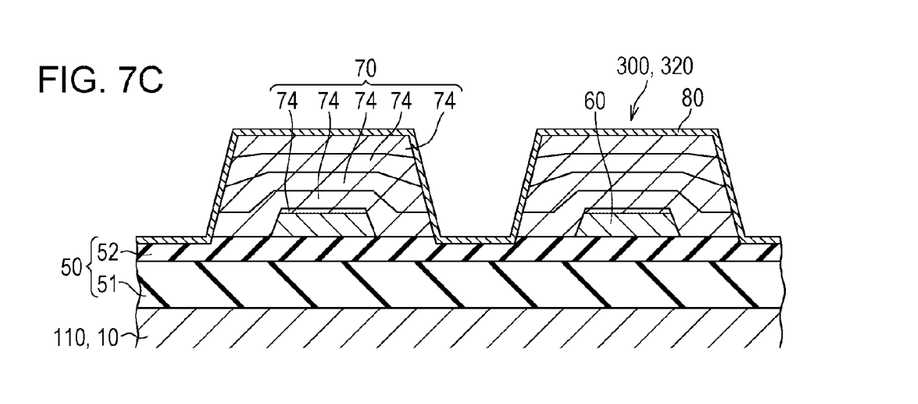

Next, as shown in FIG. 7C, the second electrode 80 is formed of, for example, iridium (Ir) across the top of the piezoelectric material layer 70 and the top of the insulator film 52, and is then patterned in a predetermined shape, forming the piezoelectric elements 300 as a result.

Figure 8A:
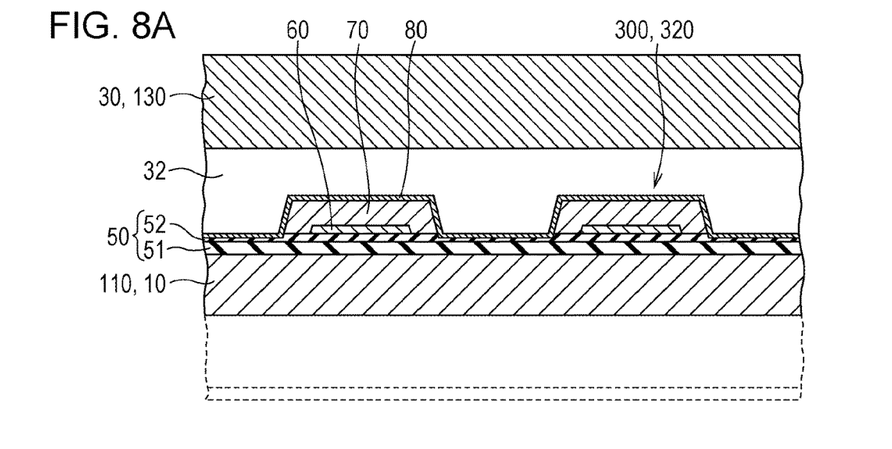
FIGS. 8A to 8C are cross-sectional views illustrating a method for manufacturing a recording head according to the first embodiment of the invention.

Next, as shown in FIG. 8A, a protective plate wafer 130, which is a silicon wafer and serves as a plurality of the protective plates 30, is affixed to the side of the piezoelectric elements 300 of the flow channel formation plate wafer 110 using the adhesive 35 (see FIG. 2B), after which the thickness of the flow channel formation plate wafer 110 is reduced to a predetermined thickness.

Figure 8B:
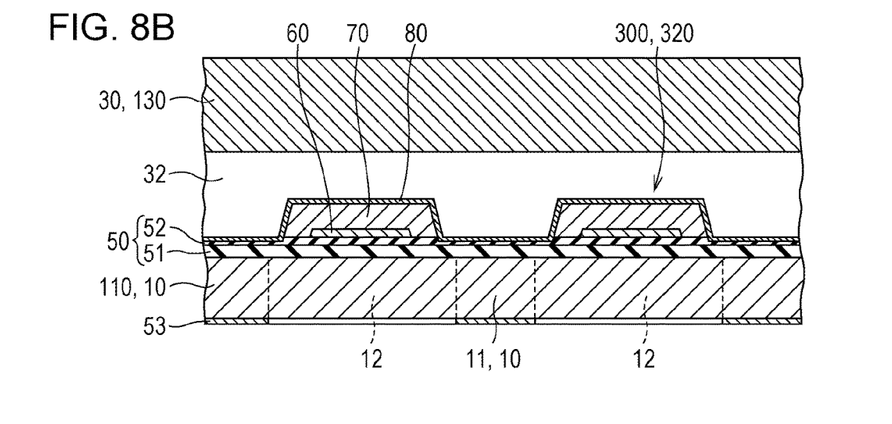
Figure 8C:
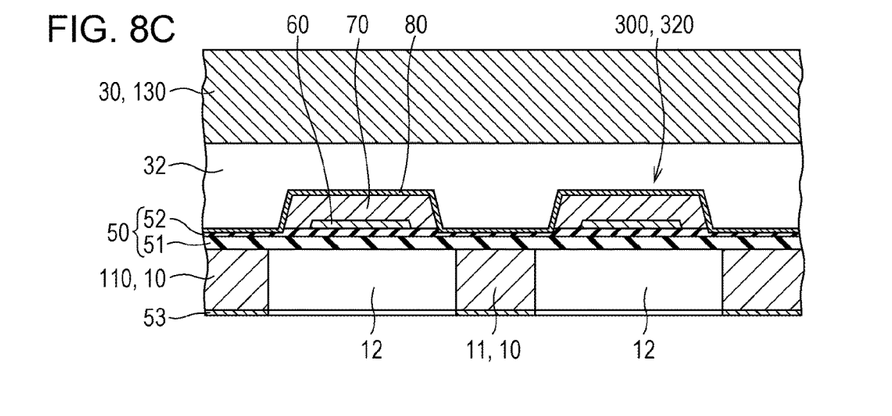

Next, as shown in FIG. 8B, a masking film 53 is newly formed on the flow channel formation plate wafer 110 and is patterned in a predetermined shape. Then, as shown in FIG. 8C, the pressure generation chambers 12 corresponding to the piezoelectric elements 300, the ink supply channels 13, the communication channels 14, the communication portion 15 and the like are formed by performing anisotropic etching (wet etching) using an alkali solution such as KOH on the flow channel formation plate wafer 110 over the masking film 53.

After this, unnecessary areas on the outer edges of the flow channel formation plate wafer 110 and the protective plate wafer 130 are cut off and removed through dicing or the like. The ink jet recording head according to this embodiment is then obtained by affixing the nozzle plate 20, in which the nozzle openings 21 are provided, to the surface of the flow channel formation plate wafer 110 on the opposite side to the protective plate wafer 130, affixing the compliance plate 40 to the protective plate wafer 130, and dividing the flow channel formation plate wafer 110 and the like into the flow channel formation plates 10 having the single chip size shown in FIG. 1.

Other Embodiments

Although the invention has been described thus far according to an embodiment, the invention is not intended to be limited to the basic configuration described above.

For example, although the above first embodiment describes an example in which the piezoelectric material layer 70 for the piezoelectric elements 300 is provided continuously, the piezoelectric material layer 70 may, of course, be provided independently for each piezoelectric element 300.

In addition, although the above first embodiment describes reducing the thickness of the vibration plate 50 at the third regions $P_3$ by reducing the thickness of the insulator film 52 at the third regions $P_3$, the invention is not particularly limited thereto; for example, the thickness of the elastic film 51, which serves as the first vibration plate that partially configures the vibration plate 50, may be adjusted. In addition, the vibration plate 50 is not limited to being configured of the elastic film 51 and the insulator film 52, and the vibration plate 50 may include another film; in this case, the vibration plate 50 may be made thinner at the third regions $P_3$ than at the first regions $P_1$ by adjusting the thickness of that other film.

Figure 9:
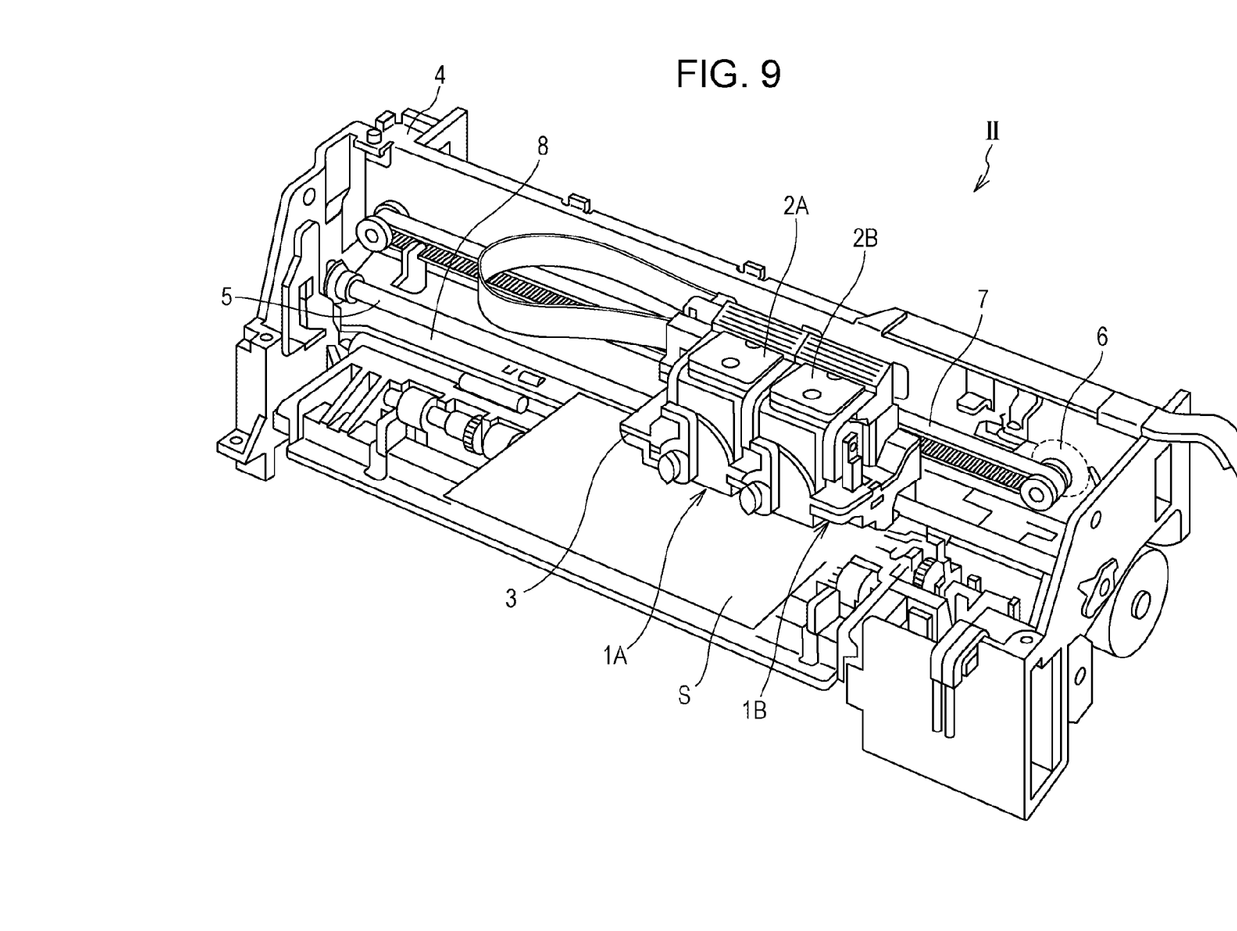
FIG. 9 is a schematic diagram illustrating a liquid ejecting apparatus according to an embodiment of the invention.

In addition, the ink jet recording head I is mounted in, for example, an ink jet recording apparatus II such as that shown in FIG. 9. A recording head unit 1 that includes the ink jet recording head I is provided with a removable ink cartridge 2 that configures an ink supply unit, and a carriage 3 in which the recording head unit 1 is mounted is provided so as to be capable of moving in an axial direction of a carriage shaft 5 attached to an apparatus main body 4. This recording head unit 1 ejects, for example, black ink compounds and color ink compounds.

Transmitting driving force generated by a driving motor 6 to the carriage 3 via a plurality of gears (not shown) and a timing belt 7 moves the carriage 3, in which the recording head unit 1 is mounted, along the carriage shaft 5. Meanwhile, a platen 8 is provided in the apparatus main body 4 along the same direction as the carriage shaft 5, and a recording sheet S, which is a recording medium such as paper supplied by paper supply rollers and the like (not shown), is wound and transported by the platen 8.

In the invention, ejection properties can be made uniform while suppressing breakdowns in the piezoelectric elements 300 that configure the ink jet recording head I as described above. As a result, the ink jet recording apparatus II, which improves printing quality and has an increased durability, can be realized.

Although the above example describes the ink jet recording head I in the ink jet recording apparatus II as being mounted in the carriage 3 and moving in a main scanning direction, it should be noted that the configuration is not particularly limited thereto. For example, the ink jet recording apparatus II may be what is known as a line-type recording apparatus, in which the ink jet recording head I is fixed and printing is carried out by moving the recording sheet S such as paper in a sub scanning direction.

In addition, although the ink jet recording apparatus II is described in the above example as being configured so that the ink cartridge 2, which serves as a liquid holding unit, is mounted in the carriage 3, the configuration is not particularly limited thereto; for example, a liquid holding unit such as an ink tank may be fixed to the apparatus main body 4, and the holding unit and the ink jet recording head I may be connected via a supply pipe such as a tube. Furthermore, the liquid holding unit need not be mounted in the ink jet recording apparatus.

Furthermore, although the above embodiment describes the invention using an ink jet recording head as an example of the liquid ejecting head, the invention is generally applicable in all liquid ejecting heads. Various types of recording heads used in image recording apparatuses such as printers, coloring material ejecting heads used in the manufacture of color filters for liquid-crystal displays and the like, electrode material ejecting heads used in the formation of electrodes for organic EL displays, FEDs (field emission displays), and so on, bioorganic matter ejecting heads used in the manufacture of biochips, and so on can be given as other examples of liquid ejecting heads.

Furthermore, the invention is not limited to piezoelectric elements used in liquid ejecting heads, and can be applied in other devices as well. Ultrasound devices such as ultrasound wave transmitters, ultrasound motors, piezoelectric transformers, and the like can be given as examples of such devices. The invention can also be applied in piezoelectric elements used as sensors. Infrared sensors, ultrasound sensors, thermal sensors, pressure sensors, pyroelectric sensors, and so on can be given as examples of sensors in which piezoelectric elements are used.

What is claimed is:
1. A liquid ejecting head comprising:
a vibration plate; and
a piezoelectric element provided on the vibration plate, the piezoelectric element including a first electrode and a second electrode that sandwich a piezoelectric material layer therebetween,
wherein the piezoelectric material layer extends to an outer side of an end portion of the first electrode;

the vibration plate has a first region opposed to the first electrode, and a third region provided further toward the outer side than the piezoelectric material layer; and the third region has a thickness that is less than a thickness of the first region.

2. The liquid ejecting head according to claim 1, wherein the vibration plate has a first vibration plate, and a second vibration plate provided on a side of the first vibration plate on which the first electrode is located.

3. The liquid ejecting head according to claim 2, wherein a thickness of the second vibration plate at the third region is 20 to 80% of a thickness of the second vibration plate at the first region.

4. A liquid ejecting head comprising:
a vibration plate; and
a piezoelectric element provided on the vibration plate, the piezoelectric element including a first electrode and a second electrode that sandwich a piezoelectric material layer therebetween,
wherein
the piezoelectric material layer extends to an outer side of an end portion of the first electrode;
the vibration plate has a second region opposed to an area of the piezoelectric material layer that extends further toward the outer side than the first electrode, and a third region provided further toward the outer side than the piezoelectric material layer;
the second region has a thickness that is greater than the thickness of the third region.

5. A liquid ejecting apparatus comprising the liquid ejecting head according to claim 1.

6. A liquid ejecting apparatus comprising the liquid ejecting head according to claim 2.

7. A liquid ejecting apparatus comprising the liquid ejecting head according to claim 3.

8. A liquid ejecting apparatus comprising the liquid ejecting head according to claim 4.

9. A piezoelectric element comprising:
a vibration plate;
a first electrode provided on the vibration plate;
a piezoelectric material layer provided on the first electrode; and
a second electrode provided on the piezoelectric material layer,
wherein
the piezoelectric material layer extends to an outer side of an end portion of the first electrode;
the vibration plate has a first region opposed to the first electrode, and a third region provided further toward the outer side than the piezoelectric material layer;
the third region has a thickness that is less than a thickness of the first region.

10. A piezoelectric element comprising:
a vibration plate;
a first electrode provided on the vibration plate;
a piezoelectric material layer provided on the first electrode; and
a second electrode provided on the piezoelectric material layer,
wherein
the piezoelectric material layer extends to an outer side of an end portion of the first electrode;
the vibration plate has a second region opposed to an area of the piezoelectric material layer that extends further toward the outer side than the first electrode, and a third region provided further toward the outer side than the piezoelectric material layer;
the third region has a thickness that is less than a thickness of the first region.

* * * * *